United States Patent [19]
Ichihara

[11] Patent Number: 5,878,087
[45] Date of Patent: *Mar. 2, 1999

[54] SIGNAL COMMUNICATION DEVICE OPERABLE IN A CDMA MODE AND AN FM MODE

[75] Inventor: Masaki Ichihara, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 310,084

[22] Filed: Sep. 22, 1994

[30] Foreign Application Priority Data

Sep. 22, 1993 [JP] Japan .................................... 5-259155

[51] Int. Cl.⁶ ............................. H03K 9/00; H03L 27/06; H03L 27/14; H03L 27/22
[52] U.S. Cl. ......................... 375/316; 375/342; 370/319; 455/207; 455/180.1
[58] Field of Search ..................................... 375/316, 205, 375/200, 317, 320, 321, 340, 346, 342; 455/227, 228, 229, 205, 206–207, 208–210, 266, 303–306, 84, 180.1, 188.1, 183.1, 190.1; 332/119; 329/316, 317; 370/319; 331/2

[56] References Cited

U.S. PATENT DOCUMENTS

| | | | |
|---|---|---|---|
| 4,748,642 | 5/1988 | Bertsche | 375/340 |
| 4,944,025 | 7/1990 | Gehring | 455/207 |
| 5,150,377 | 9/1992 | Vannucci | 375/200 |
| 5,291,516 | 3/1994 | Dixon et al. | 375/200 |

FOREIGN PATENT DOCUMENTS

WO 96/20540 7/1996 WIPO ............................. H04B 1/40

OTHER PUBLICATIONS

"Mobile Station–Base Station Compatibility Standard for Dual–Mode Wideband Spread Spectrum Cellular System", by Telecommunications Industry Association, Jul. 1993, pp. vii–xxxi and 6–1 to 7–42.

*Primary Examiner*—Chi H. Pham
*Assistant Examiner*—Bryan Webster
*Attorney, Agent, or Firm*—Sughrue, Mion, Zinn, Macpeak & Seas, PLLC

[57] ABSTRACT

In a dual CDMA mode and FM mode receiver, a local oscillator selectively outputs a local oscillation signal for a CDMA mode or a local oscillation signal for an FM mode in response to a command. A mixer mixes the local oscillation signal with an intermediate frequency signal to produce a signal having a predetermined frequency. Filters assigned to a CDMA mode and an FM mode, respectively, each filters the output of the mixer. After an AGC amplifier has amplified the output of the filter, a digital signal processor demodulates the output of the amplifier. Switches are provided for selecting either a CDMA mode or an FM mode.

14 Claims, 4 Drawing Sheets

SIGNAL COMMUNICATION DEVICE OPERABLE IN A CDMA MODE AND AN FM MODE

BACKGROUND OF THE INVENTION

1. Field of the Invention

The present invention relates to a signal communication device and, more particularly, to a signal communication device operable both in a code division multiple access (CDMA) mode and in a frequency modulation (FM) mode.

2. Description of the Related Art

Typical of automobile and portable telephone systems are frequency division multiple access (FDMA) system and a code division multiple access (CDMA) system. The FDMA system assigns a single channel to a single frequency band width. For example, the American standard advanced mobile phone system (AMPS), which is implemented by the FDMA system, assigns a frequency band of 30 kHz to a single telephone channel.

A current trend in radio telecommunications is toward a digital cellular system, as distinguished from the conventional AMPS or similar analog cellular system. A digital cellular system is advantageous over the analog system in that it accommodates a greater number of subscribers, insures stable sound quality, has a secrecy function, and matches other digital services. Particularly, a CDMA system proposed by Qualcomm scatters 10 kHz coded voice data to a frequency band of 1.25 MHz and allows a plurality of conversation channels to share the same frequency band. This CDMA system is a promising system since it insures a frequency utilization efficiency ten times to twenty times that of the AMPS system.

Such a CDMA system is disclosed, for example, in a paper entitled "TIA/SIA INTERIM STANDARD" by TELECOMMUNICATIONS INDUSTRY ASSOCIATION, pages 6-1 to 7-42, and published in July 1993.

In North America, however, it is a prerequisite that a new digital system be introduced together with an apparatus also operable in the conventional AMPS system, so-called dual mode. Therefore, a receiver circuit built in a cellular telephone has to be adaptive to both of AMPS and CDMA.

To better understand the present invention, a brief reference will be made to a prior art receiver of the AMPS cellular terminal unit, shown in FIG. 1. The receiver is implemented as a double superheterodyne receiver.

The receiver includes an antenna 1, a band-pass filter 2 for filtering a high frequency signal coming in through the antenna 1, a high frequency amplifier 3, a first mixer 4 for combining the output of the amplifier 3 with a first local oscillation signal to produce a first intermediate frequency (IF) signal, a first IF filter 6 for filtering the first IF signal, a first IF amplifier 7 for amplifying the output of the IF filter 6, and a second mixer 8 for combining the output of the IF amplifier 7 with a second local oscillation signal to thereby output a second IF signal.

In operation, the antenna 1 receives a high frequency signal lying in the range of from 869.04 MHz to 893.97 MHz. The bandpass filter, or high frequency filter, 2 supplies a signal component lying in the above-mentioned range. The high frequency amplifier, or low noise amplifier (LNA), 3 amplifies the filtered signal component. The first mixer 4 mixes the output of the amplifier 3 with a first local oscillation signal, thereby producing a first IF signal. The first local oscillation signal is generated by a first local oscillator 5. Usually, the local oscillator 5 is implemented by a phase locked loop (PLL) synthesizer in order to change the frequency on a 30 kHz basis for channel selection. The first IF signal usually lies in a frequency band of 70 MHz or 90 MHz.

The first IF signal is further filtered by the first IF filter 6 so as to have spurious components thereof removed. The first IF amplifier 7 amplifies the filtered signal of the IF filter 6. The second mixer 8 mixes the amplified signal of the amplifier 7 with a second local oscillation signal to output a second IF signal whose frequency is usually about 450 kHz. The second local oscillation signal is generated by a second local oscillator 9. The second IF filter 10 filters the second IF signal for thereby removing spurious waves farther than the adjoining channels. A limiter amplifier 11 amplifies the output signal of the second IF filter 10 to saturation, thereby removing varying amplitude components. The output of the limiter amplifier 11 is applied to a frequency discriminator 12 with the result that voice, or FM signal, is reproduced. Although the limiter amplifier 11 removes amplitude components from the second IF signal, it outputs a voltage corresponding to a field strength, i.e., received signal strength indicator (RSSI). The receiver senses a received field strength by use of the RSSI signal. The second IF filter 10, limiter amplifier 11 and frequency discriminator 12, among others, are extensively used and available at extremely low cost.

Analog-to-digital converters (A/D) 13 and 14 convert the voice signal and RSSI signal to digital signals, respectively, and supply the digital signals to a digital signal processor (DSP) 15.

The circuitry shown in FIG. 1 cannot accommodate the CDMA system for the following reasons. As for the AMPS system, the band width per channel is less than 30 kHz and can be easily dealt with by the second IF filter whose frequency band is 450 kHz. However, when it comes to the CDMA system, the band width is as broad as about 1.2 MHz and cannot be handled by the second IF filter.

Furthermore, the AMPS system is an FM system and the received signal does not contain any amplitude information thereof. This allows an inexpensive limiter amplifier to be used. By contrast, the CDMA system is a four-phase phase shift keying (PSK) modulation system and the signal contains information even in amplitude modulation. Therefore, the inexpensive limiter amplifier cannot be used in the CDMA system. In addition, nonlinear processing is not available with the CDMA system since telephone signals of as many as about sixty subscribers exist together on a signal frequency channel.

SUMMARY OF THE INVENTION

It is therefore an object of the present invention to provide a signal communication device operable both in a CDMA mode and in an FM mode.

According to the present invention, the inventive signal communication device includes an oscillator for selectively outputting one of a first local oscillation signal having a first frequency and a second local oscillation signal having a second frequency in response to a control signal, a mixer for mixing the first or second local oscillation signal with a received signal and for supplying one of a first and second mixed signal, and filters for filtering the first mixed signal and the second mixed signal and for supplying a first and second filtered signal, respectively.

BRIEF DESCRIPTION OF THE DRAWINGS

The above and other objects, features and advantages of this invention will become more apparent from the following detailed description taken with the accompanying drawings in which.

In the drawings, the same reference numerals denote the same structural elements.

DESCRIPTION OF THE PREFERRED EMBODIMENTS

The preferred embodiments of the present invention will be described in detail with reference to FIGS. 2 to 4.

Figure 1:
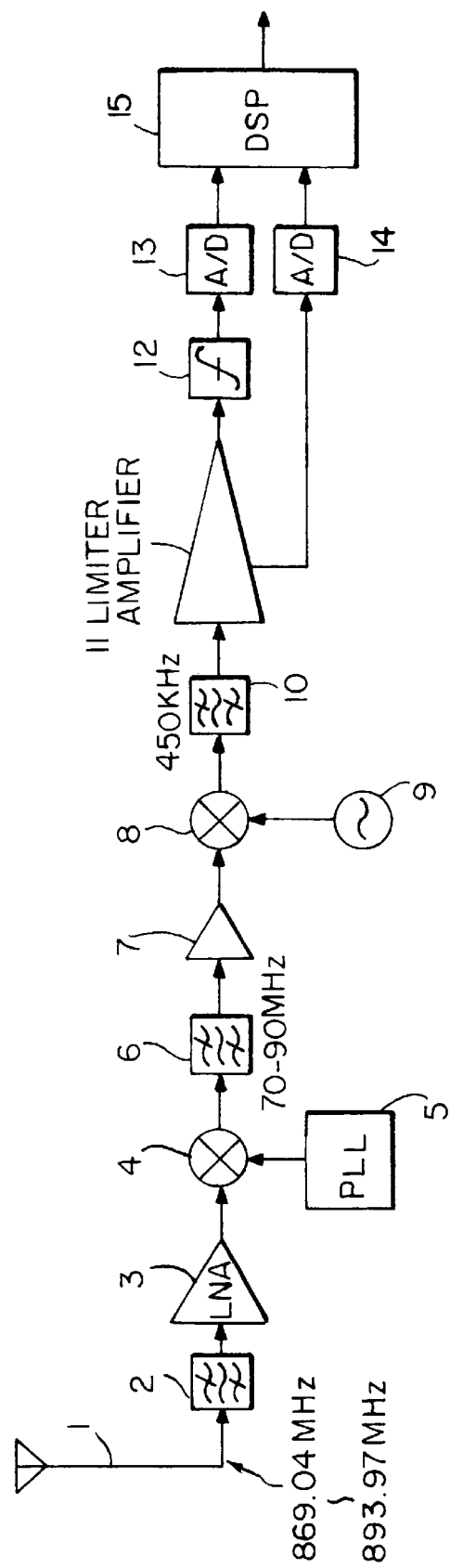
FIG. 1 is a block diagram schematically showing essential parts of a receiver included in a conventional AMPS cellular terminal unit.
Figure 2:
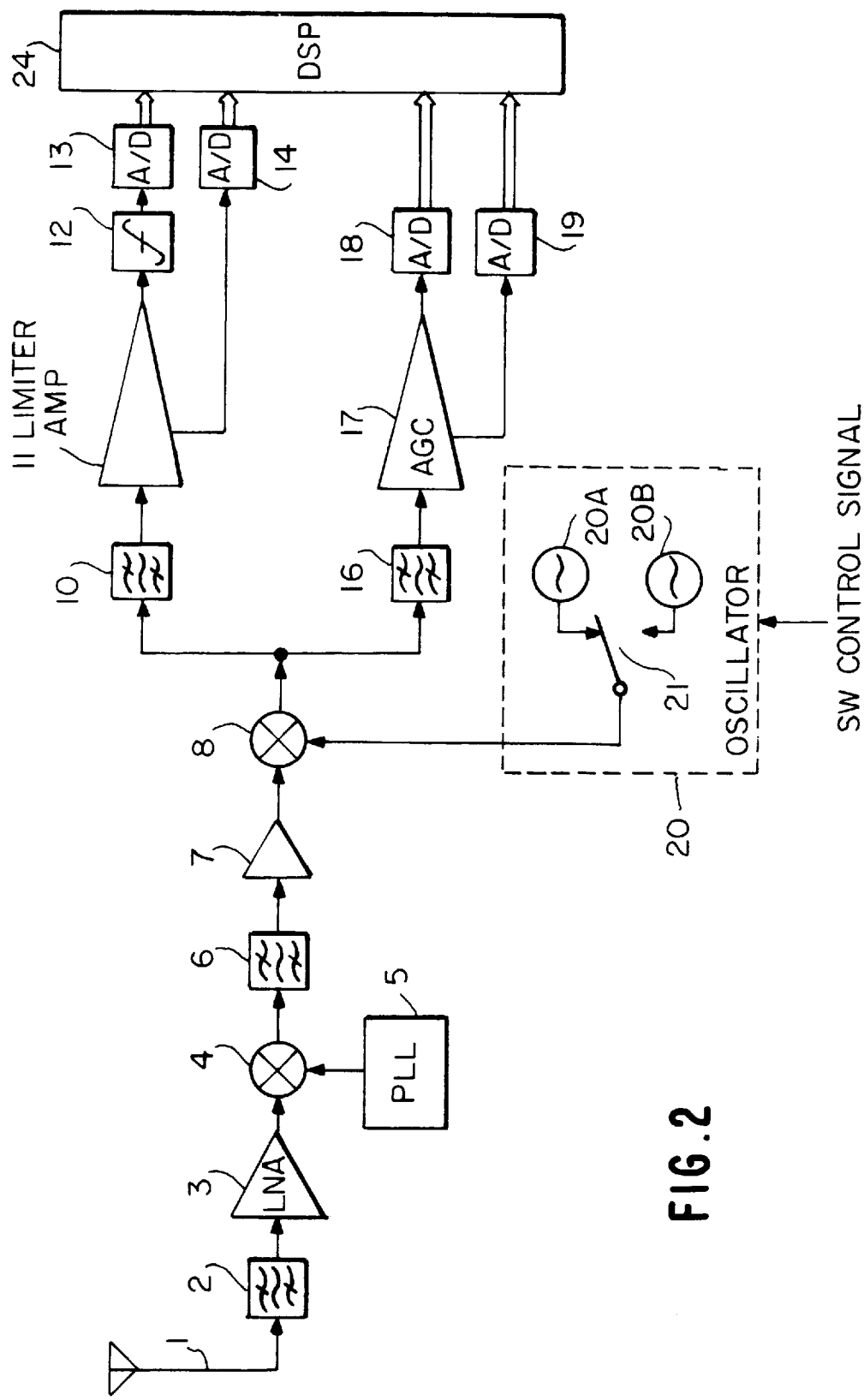
FIG. 2 is a block diagram schematically showing a preferred embodiment of an essential part of a dual CDMA mode and FM mode receiver embodying the present invention.

FIG. 2 is a block diagram schematically showing a preferred embodiment of a dual CDMA mode and FM mode receiver according to the present invention. In FIG. 2, the same or similar constituent parts as or to the constituents shown in FIG. 1 are designated by the same reference numerals, and a detailed description thereof will not be made in order to avoid redundancy.

In FIG. 2, the receiver has, in addition to the constituents of the conventional receiver shown in FIG. 1, an IF filter 16, an automatic gain control (AGC) amplifier 17, and analog-to-digital converters (ADCs) 18 and 19 which are assigned to a CDMA mode.

The IF filter 16 filters a second IF signal from a mixer 8 while the AGC amplifier 17 amplifies the filtered signal of the IF filter 16. The ADC 18 digitizes the analog signal of the AGC amplifier 17 and delivers the resulting digital output thereof to a digital signal processor (DSP) 24. The ADC 19 digitizes an RSSI signal from the AGC amplifier 17 and supplies the digital RSSI signal to the DSP 24.

A local oscillator 20 has fixed oscillators 20A and 20B assigned to an FM mode and a CDMA mode, respectively.

The receiver having the above construction is expected to receive a high frequency signal whose frequency ranges from 869.04 MHz to 893.97 MHz. Assume that a first local oscillation signal, which should be an integral multiple of 30 kHz, has a frequency ranging from 939.12 MHz to 964.05 MHz and has intervals of 30 kHz. Then, a first IF signal produced by a first mixer 4 has a mean frequency of 70.08 MHz.

In the local oscillator 20, a switch 21 selects the fixed local oscillator 20A, which oscillates at 69.63 MHz, for an FM mode or selects the other fixed local oscillator 20B, which oscillates at 74.9952 MHz, for a CDMA mode. The output signal of the local oscillator 20A or 20B is applied to the second mixer 8 as a local oscillation signal. As a result, the center frequency of the second IF signal is 450 kHz in an FM mode or 4.9152 MHz, just four times a chip rate of 1.2288 MHz, for a CDMA mode. It is to be noted that the words "chip rate" refer to the rate of pseudo noise PN code such as frequency divergence code.

In an FM mode, the 450 kHz second IF signal is transformed to a baseband signal by the frequency discriminator 12 which are inexpensive, as in the conventional circuitry of FIG. 1 through the filter 10 whose center frequency is 450 kHz and the limiter amplifier 11. Since digital signal processing is predominant in a digital cellular system, the baseband signal and the previously mentioned RSSI signal are respectively digitized by ADCs 13 and 14 and then processed by the DSP 24.

On the other hand, in a CDMA mode, the filter 16 removes spurious signal components from the 4.9152 MHz second IF signal. The AGC amplifier 17, having a linear characteristic, amplifies the filtered IF signal. The AGC amplifier 17 is feasible for demodulation in a CDMA mode since it maintains instantaneous relative linearity although suppressing amplitude fluctuations of a signal. The second IF signal from the amplifier 17 is digitized by the ADC 18 and then demodulated by the DSP 24. The control voltage for controlling the gain of the AGC amplifier 17 corresponds to the received field strength and, therefore, can replace the RSSI signal particular to the FM system. The control voltage is digitized by an ADC 19 and used for the measurement of field strength.

Figure 3:
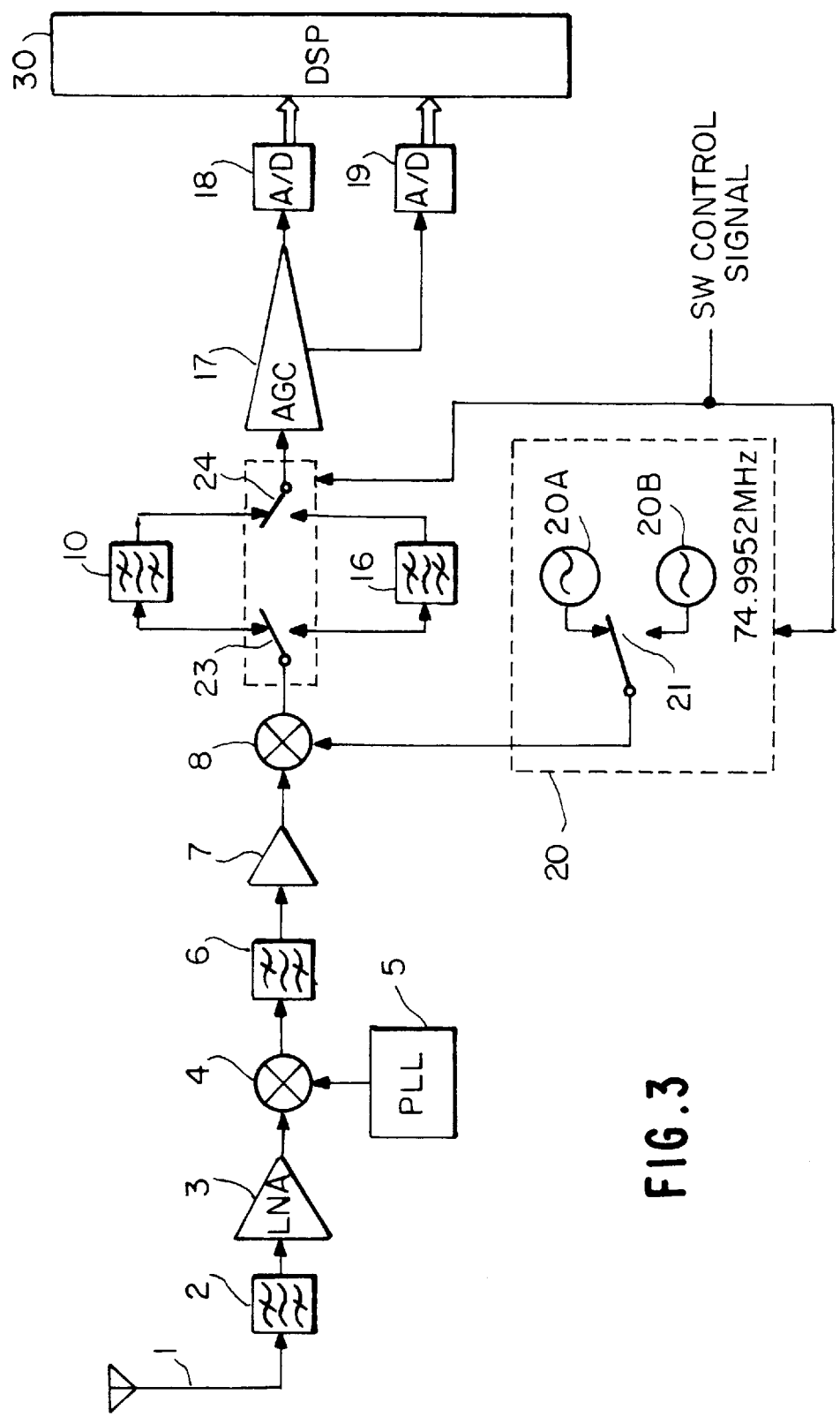
FIG. 3 is a block diagram of another preferred embodiment according to the present invention.

Referring to FIG. 3, an alternative preferred embodiment of the present invention will be described. As shown, this embodiment is identical with the previous embodiment as to the arrangement but which additionally includes switches 23 and 24 for switching between the filters 10 and 16, and eliminates the limiter amplifier 11, discriminator 12 and ADCs 13 and 14. In an FM mode, the second IF signal is routed through the 450 kHz filter 10 while, in a CDMA mode, it is passed through the 4.9152 MHz filter 16. Further, in both an FM mode and a CDMA mode, the second IF signals are amplified by the same AGC amplifier 17, digitized by the ADC 18, and then processed by a DSP 30.

Figure 4:
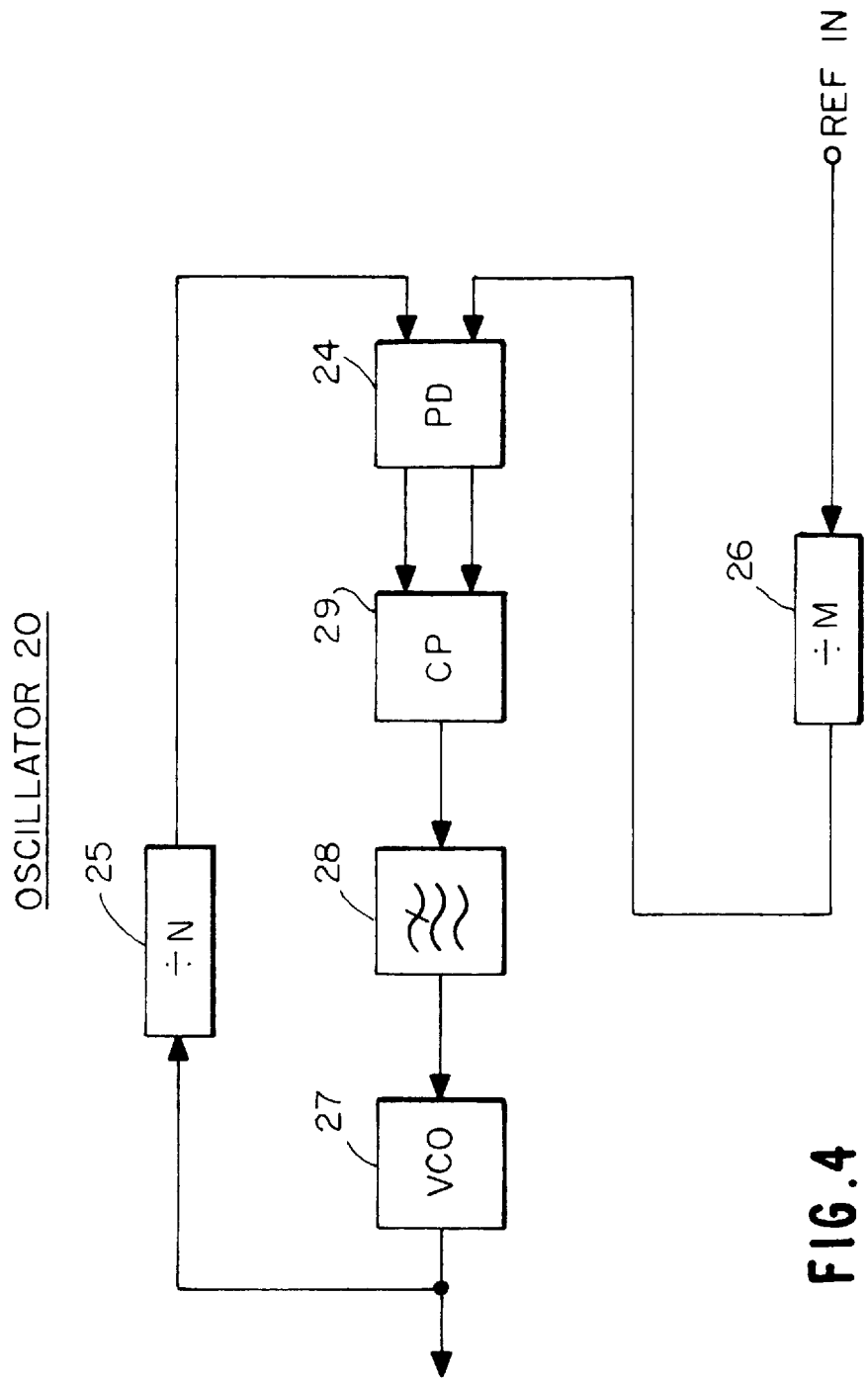
FIG. 4 is a block diagram showing a preferred embodiment of the second local oscillator shown in FIG. 2 or 3.

The local oscillator 20 shown in FIGS. 2 and 3 may be implemented by a PLL synthesizer, as shown in FIG. 4.

In FIG. 4, a reference signal REF IN may be comprised of a 14.4 MHz signal commonly used in an AMPS terminal unit. As shown, a frequency divider 26 divides the frequency of the reference signal REF IN by M. Another frequency divider 25 divides the oscillated signal of a voltage controlled oscillator (VCO) 27 by N. A phase comparator (PD) 24 compares the phases of the divided signals of the frequency dividers 26 and 25 and, based on the result of comparison, operates a charge pump (CP) 29. A loop filter 28 smooths the output voltage of the charge pump 29 and controls the oscillation frequency of the VCO 27 with the resulting output thereof. In this way, the embodiment sets up a phase-locked loop. The frequency division ratios of the dividers 25 and 26 are assumed to be freely selected.

Assume that the reference signal REF IN has a frequency $f_{ref}$, then the output frequency f0 from the VCO 27 is expressed as:

$$f0 = f_{ref} * N/M$$

Specifically, if the frequency $f_{ref}$ is 14.4 MHz, the output frequency is 69.63 MHz when N and M are 2321 and 480, respectively. The frequency of 69.63 MHz corresponds to the frequency of the previously stated second local oscillation signal for an FM mode. On the other hand, when N and M are 651 and 125, respectively, an output frequency f0 of 74.9952 MHz is produced which is the frequency of the second local oscillation signal for a CDMA mode. In this manner, the frequency division ratios of the dividers 25 and 26 are variable to generate desired oscillation frequencies for the two different modes.

The frequency of the second local oscillation signal will be described specifically. To begin with, it will be proper to provide the first IF signal with a frequency of about 70 MHz in consideration of the availability of a filter. Since the received frequency is an integral multiple of 30 kHz, the frequency of the first local oscillation signal should also be set on a 30 kHz basis, i.e., it should also be an integral multiple of 30 kHz. For this reason, the frequency of the first IF signal is assumed to be 70.08 MHz. In an FM mode, since the frequency of the second IF signal is 450 kHz, the frequency of the second local signal is produced by:

70.08 MHz±450 kHz=70.530 MHz or 69.63 MHz

In the illustrative embodiment, the frequency of 69.63 MHz is selected.

On the other hand, in a CDMA mode, since the frequency of the second IF signal is 4.9512 MHz, the frequency of the second local signal is produced by:

70.08 MHz±4.9512 MHz=74.9952 MHz or 65.1648 MHz

The embodiment selects 74.9952 MHz.

The switches 21, 23 and 24 may be operated in any one of various conventional systems.

For example, in an area where only one of the CDMA and FM systems are available, a user can operate the switches 21, 23 and 24 manually.

In the case that both systems are available, the switches are selected by a SW control signal from an adequate detector for detecting which signal is received. For example, the switch operation may be achieved by a detection of a pilot signal or a switch command signal from a base station.

Although the receiving portion of the cellular telephone is explained above, a transmitting portion is constituted similarly. For example, at one location, an FM modulation signal has up-converted its frequency by mixing with a local oscillating frequency for the FM signal and a CDMA modulation signal is mixed with another local oscillating frequency for the CDMA signal.

As described hereinbefore, according to the present invention, it is possible to provide a dual FM mode and CDMA mode signal communication device which is easy to produce and has many portions thereof shared by the two modes. The signal communication device is small size and light weight.

Although the embodiment has been described with respect to a case in which the modification was based on a specific factor, it goes without saying that the present invention is not restricted to this case.

What is claimed is:

1. A signal communication device for providing radio telecommunication by communicating a plurality of different modulation signals, comprising:

local oscillator means for producing a plurality of local oscillation signals, each one of said plurality of local oscillation signals for use in converting a corresponding one of said different modulation signals into a corresponding one of plural converted signals;

mixer means, coupled to said local oscillator means to receive said plurality of different local oscillation signals and coupled to receive the plurality of different modulation signals, for producing said converted signals, each of said converted signals having a different center frequency, wherein said local oscillator means and mixer means are located in a receiver for receiving said plurality of different modulation signals; and a plurality of filters, each of said filters to filter a respective one of said converted signals, said plurality of filters comprising:

a first filter for filtering a respective first converted signal of said converted signals and having a first center frequency substantially equal to a center frequency of said first converted signal, and a second filter for filtering a respective second converted signal of said converted signals and having a second center frequency substantially equal to a center frequency of said second converted signal, wherein said plurality of different modulation signals includes at least an FM modulation signal and a CDMA modulation signal, and said first filter functions only when said CDMA modulation signal is received by the signal communication device, and said second filter functions only when said FM modulation signal is received by the signal communication device.

2. The signal communication device as claimed in claim 1, further comprising:

detecting means for detecting said first filtered signal; and amplifying means for amplifying said second filtered signal.

3. The receiver as claimed in claim 2, wherein said detecting means comprises:

an amplifier for amplifying said first filtered signal and for supplying an amplified signal; and a discriminator for transforming said amplified signal to a baseband signal.

4. The signal communication device as claimed in claim 1, wherein said local oscillator means comprises:

a voltage controlled oscillator for supplying a selected one of said plurality of local oscillation signals;

a first frequency divider for dividing a frequency of said local oscillation signal and for supplying a first divided signal;

a second frequency divider for dividing a frequency of a reference signal and for supplying a second divided signal; and a phase comparator for supplying a phase difference between said first divided signal and second divided signal to said voltage controlled oscillator;

said first and second frequency dividers each having selective division ratios.

5. The signal communication device as claimed in claim 1, wherein said local oscillator means comprises:

first local oscillator for oscillating a first local oscillation signal having a first frequency and for use in converting one modulation signal; and second local oscillator for oscillating a second local oscillation signal having a second frequency and for use in converting another modulation signal.

6. The signal communication device as claimed in claim 1, further comprising:

filter selecting means for connecting said mixer means to one of said plurality of filters.

7. The signal communication device as claimed in claim 4, wherein said first filter is supplied an FM signal and said second filter is supplied a CDMA signal.

8. A double superheterodyne receiver comprising:

first frequency converting means for converting a plurality of received different modulation signals to first converted signals at a first intermediate frequency;

second frequency converting means for converting said first converted signals at said first intermediate frequency to second converted signals at a plurality of second intermediate frequencies, each of said second intermediate frequencies corresponding to one of said plurality of received different modulation signals and each of said second intermediate frequencies being different from one another; and a plurality of filters, each one said plurality of filters to filter a respective one of said second converted signals, each one of said plurality of filters having a center frequency substantially equal to a corresponding one of said second intermediate frequencies, said plurality of filters comprising:

first filter for filtering one of said second converted signals at a respective one of said second intermediate frequencies, and a second filter for filtering another one of said second converted signals at a respective different one of said second intermediate frequencies, wherein said second frequency converting means comprises:

local oscillator means for producing a plurality of local oscillation signals, each local oscillation signal for use in converting one of said first converted signals; and mixer means, coupled to said local oscillator means to receive one of said plurality of local oscillation signals and coupled to receive a corresponding one of said first converted signals, for producing one of said second converted signals, wherein said plurality of received different modulation signals includes at least an FM modulation signal and a CDMA modulation signal, and said first filter functions only when said CDMA modulation signal is received by the double superheterodyne receiver, and said second filter functions only when said FM modulation signal is received by the double superheterodyne receiver.

9. The receiver as claimed in claim 8, wherein said local oscillator means comprises:

a voltage controlled oscillator for supplying one of said plurality of local oscillation signals;

a first frequency divider for dividing a frequency of said local oscillation signal and for supplying a first divided signal;

a second frequency divider for dividing a frequency of a reference signal and for supplying a second divided signal; and a phase comparator for supplying a phase difference between said first divided signal and second divided signal to said voltage controlled oscillator;

said first and second frequency dividers each having selective division ratios.

10. The receiver as claimed in claim 8, wherein said local oscillator means comprises:

first local oscillator for oscillating a first local oscillation signal having a first frequency and for use in converting one of said first converted signals; and second local oscillator for oscillating a second local oscillation signal having a second frequency and for use in converting another of said first converted signals.

11. The receiver as claimed in claim 8, wherein one frequency of said local oscillation signals being 70.08 MHz±450 kHz and another frequency of said local oscillation signals being 70.08 MHz±4.9512 MHz.

12. A method for controlling a signal communication device for communicating a plurality of different modulation signals, the method comprising the steps of:

producing a plurality of local oscillation signals, each local oscillation signal for use in converting one of said different modulation signals into one of a plurality of corresponding converted signals;

producing one of said converted signals by mixing one of said plurality of local oscillation signals with one of said different modulation signals so that each one of said converted signals has a different center frequency; and filtering said one of said converted signals using a filter having a center frequency substantially equal to the unique center frequency of said one of said converted signals, wherein said filtering step is accomplished using a first filter of said signal communication device having a first center frequency to filter a first converted signal of said converted signals, and using a second filter of said signal communication device having a second center frequency, different from said first center frequency, to filter a second converted signal of said converted signals, wherein said plurality of different modulation signals includes at least an FM modulation signal and a CDMA modulation signal, and said first converted signal is filtered only when said CDMA modulation signal is received by said signal communication device, and said second converted signal is filtered only when said FM modulation signal is received by the signal communication device.

13. A method for controlling a receiver for receiving a plurality of different modulation signals, the method comprising the steps of:

producing a plurality of local oscillation signals, each local oscillation signal for use in converting one of said different modulation signals into one of a plurality of corresponding converted signals;

producing one of said converted signals by mixing one of said plurality of local oscillation signals with one of said different modulation signals so that each one of said converted signals has a different center frequency; and filtering said one of said converted signals using a filter having a center frequency substantially equal to the unique center frequency of said one of said converted signals, wherein said filtering step is accomplished using a first filter of said signal communication device having a first center frequency to filter a first converted signal of said converted signals, and using a second filter of said signal communication device having a second center frequency, different from said first center frequency, to filter a second converted signal of said converted signals, wherein said plurality of different modulation signals includes at least an FM modulation signal and a CDMA modulation signal, and said first converted signal is filtered only when said CDMA modulation signal is received by the receiver, and said second converted signal is filtered only when said FM modulation signal is received by the receiver.

14. A method for controlling a receiver for receiving a received signal selected from two different modulation signals, the method comprising the steps of:

(a) oscillating a first local oscillation signal having a first frequency when the received signal is a first modulation signal;

(b) oscillating a second local oscillation signal having a second frequency when the received signal is a second modulation signal different from said first modulation signal;

(c) mixing said first local oscillation signal with said received first modulation signal, when the received signal is the first modulation signal, to produce a first converted signal at a first intermediate frequency;

(d) mixing said second local oscillation signal with said received second modulation signal, when the received signal is the second modulation signal, to produce a second converted signal at a second intermediate frequency;

(e) filtering said first converted signal using a filter of the receiver having a center frequency substantially equal to said first intermediate frequency; and (f) filtering said second converted signal using a filter of the receiver having a center frequency substantially equal to said second intermediate frequency, wherein said first modulation signal is an FM modulation signal and said second modulation signal is a CDMA modulation signal, and said filtering in said step (e) is performed only when said CDMA modulation signal is received by the receiver, and said filtering in said step (f) is performed only when said FM modulation signal is received by the receiver.

* * * * *